(12) United States Patent
Kosugi et al.

(10) Patent No.: US 9,072,189 B2
(45) Date of Patent: Jun. 30, 2015

(54) SUBSTRATE UNIT

(75) Inventors: Hajime Kosugi, Okazaki (JP); Ken Asakura, Toyota (JP)

(73) Assignee: TOYOTA JIDOSHA KABUSHIKI KAISHA, Aichi-ken (JP)

( * ) Notice: Subject to any disclaimer, the term of this patent is extended or adjusted under 35 U.S.C. 154(b) by 18 days.

(21) Appl. No.: 13/983,832

(22) PCT Filed: Mar. 16, 2011

(86) PCT No.: PCT/JP2011/056209
§ 371 (c)(1),
(2), (4) Date: Aug. 6, 2013

(87) PCT Pub. No.: WO2012/124074
PCT Pub. Date: Sep. 20, 2012

(65) Prior Publication Data
US 2013/0308257 A1 Nov. 21, 2013

(51) Int. Cl.
 H05K 7/12 (2006.01)
 H05K 7/14 (2006.01)
 H05K 9/00 (2006.01)
(52) U.S. Cl.
 CPC .............. *H05K 7/12* (2013.01); *H05K 7/1432* (2013.01); *H05K 7/1417* (2013.01); *H05K 9/0067* (2013.01)
(58) Field of Classification Search
 CPC .... H05K 1/182; H05K 9/0067; H05K 7/1417
 USPC ...................... 361/761, 679.01, 818
 See application file for complete search history.

(56) References Cited

U.S. PATENT DOCUMENTS

| | | | | |
|---|---|---|---|---|
| 4,132,915 A | * | 1/1979 | Wilms | 313/325 |
| 7,911,806 B2 | * | 3/2011 | Funato et al. | 361/818 |
| 7,965,510 B2 | * | 6/2011 | Suzuki et al. | 361/699 |
| 2001/0012212 A1 | | 8/2001 | Ikeda | |
| 2003/0182955 A1 | * | 10/2003 | Hirao et al. | 62/202 |
| 2005/0254212 A1 | * | 11/2005 | Su et al. | 361/695 |
| 2008/0123272 A1 | * | 5/2008 | Kang | 361/681 |
| 2008/0226446 A1 | * | 9/2008 | Fujieda | 415/203 |
| 2009/0251843 A1 | * | 10/2009 | Hironaka | 361/216 |

FOREIGN PATENT DOCUMENTS

| | | |
|---|---|---|
| EP | 2 043 418 A2 | 4/2009 |
| JP | 63-101465 A | 7/1988 |

(Continued)

OTHER PUBLICATIONS

(Machine Translation of JP 2007329003 A) Hironaka, Yoshiomi, Onboard Electronic Device and Vehicle Mounting the Same, Dec. 20, 2007, JPO.*

*Primary Examiner* — William H Mayo, III
*Assistant Examiner* — Hiram E Gonzalez
(74) *Attorney, Agent, or Firm* — Sughrue Mion, PLLC (57) ABSTRACT

A substrate unit includes a conductive case, an insulating case arranged in the conductive case, a first screw member having conductivity, arranged in the conductive case and fixing the insulating case to an inner wall surface of the conductive case, a circuit substrate provided opposite to the inner wall surface with respect to the insulating case and fixed to the insulating case, and a second screw member having conductivity and fixing the circuit substrate to the insulating case. The first screw member and the second screw member are screwed in toward the inner wall surface. The first screw member and the second screw member are spaced from each other. The first screw member and the second screw member are connected to each other with a connecting member having conductivity.

6 Claims, 6 Drawing Sheets

(56) References Cited

FOREIGN PATENT DOCUMENTS

| JP | 05-026668 U | 4/1993 |
| JP | 3056946 A | 12/1998 |
| JP | 11-354946 A | 12/1999 |
| JP | 2000-037507 A | 2/2000 |
| JP | 2007-329003 A | 12/2007 |
| JP | 2007329003 A * | 12/2007 |

* cited by examiner

SUBSTRATE UNIT

CROSS REFERENCE TO RELATED APPLICATIONS

This is a National Stage of International Application No. PCT/JP2011/056209, filed Mar. 16, 2011, the contents of all of which are incorporated herein by reference in their entirety.

TECHNICAL FIELD

The present invention relates to a substrate unit, and particularly relates to a substrate unit in which a substrate is provided in a case.

BACKGROUND ART

Conventionally, various types of structures of a substrate unit having a substrate provided therein for causing static electricity to escape from the substrate to a body earth have been proposed.

For example, an on-board electronic device described in Japanese Patent Laying-Open No. 2007-329003 includes a conductive enclosure, a resin case arranged in the enclosure, a control substrate stored in the enclosure and having a conductive pattern formed thereon, a conductive plate in contact with this conductive pattern, and a screw fixing the control substrate and the conductive plate to a boss provided for the resin case.

A game machine described in Japanese Patent Laying-Open No. 2000-37507 includes a substrate box and an attachment assistance member having conductivity to which this substrate box is fixed.

The substrate box includes an upper lid member and a bottom lid member. The substrate is stored between the upper lid member and the bottom lid member.

The bottom lid member has formed thereon a cylindrical first engagement part having a hole formed therein. The upper lid member also has formed thereon a cylindrical second engagement part having a hole formed therein.

The attachment assistance member has a plate shape. The attachment assistance member is provided with a cylindrical conduction assistance member. This conduction assistance member is provided at a portion of the inner surface of the attachment assistance member that is opposite to the first engagement part of the bottom lid member.

The conduction assistance member is fixed with a first screw provided at the outer surface side of the attachment assistance member. The first screw penetrates the attachment assistance member to fix the conduction assistance member to the inner surface of the attachment assistance member.

This conduction assistance member has formed therein a female screw hole extending therethrough in the axial direction. The conduction assistance member is inserted in the hole of the first engagement part of the bottom lid member.

The substrate is fixed to the leading end of the cylindrical conduction assistance member with a second screw. Specifically, the second screw includes a shaft part inserted in the hole of the conduction assistance member and a head part provided on an end of this shaft part. The substrate is held between the head part of the second screw and the leading end of the conduction assistance member. The second screw is inserted from the outside through the hole of the second engagement part. The substrate is electrically connected to the conductive attachment assistance member with the conduction assistance member.

It is noted that the measures against static electricity as described above are not limited to the substrate unit including a circuit substrate or a control substrate, but has also been proposed in various fields.

For example, Japanese Utility Model Laying-Open No. 5-26668 proposes a structure for taking measures against static electricity in a recess of a door trim for vehicle.

CITATION LIST

Patent Document

PTD 1: Japanese Patent Laying-Open No. 2007-329003
PTD 2: Japanese Patent Laying-Open No. 2000-37507
PTD 3: Japanese Utility Model Laying-Open No. 5-26668

SUMMARY OF INVENTION

Technical Problem

In the on-board electronic device described in Japanese Patent Laying-Open No. 2007-329003, a case occurs in which conduction between the control substrate and the enclosure cannot be ensured.

In the game machine described in Japanese Patent Laying-Open No. 2000-37507, the conduction assistance member is fixed to the inner surface of the attachment assistance member with the second screw provided on the outer surface of the attachment assistance member.

On the other hand, a fixing member, such as a screw, may be unable to be provided from the outside of the case because of the structure of the substrate unit, which may require the substrate or the like to be fixed with a fixing member provided inside the case.

The present invention was made in view of the problems as described above, and has an object to provide a substrate unit including a case and a substrate stored in the case, the substrate being fixed with a fixing member provided in the case, wherein conduction between the substrate and the case can be ensured.

Solution to Problem

A substrate unit according to the present invention includes a conductive case having conductivity, an insulating case arranged in the conductive case, a first screw member having conductivity, arranged in the conductive case and fixing the insulating case to an inner wall surface of the conductive case, a circuit substrate provided opposite to the inner wall surface with respect to the insulating case and fixed to the insulating case, and a second screw member having conductivity and fixing the circuit substrate to the insulating case. The first screw member and the second screw member are screwed in toward the inner wall surface. When the first screw member and the second screw member are seen from a position away from the inner wall surface in a direction that the inner wall surface and the insulating case are arranged, the first screw member and the second screw member are spaced from each other. The first screw member and the second screw member are connected to each other with a connecting member having conductivity.

Preferably, the substrate unit further includes a cooler arranged between the inner wall surface of the conductive case and the insulating case, and an element arranged in the insulating case. The insulating case includes a projecting part projecting from an outer circumference of the cooler. The first screw member is provided in the projecting part. The second screw member is arranged opposite to the cooler with respect to the insulating case.

Preferably, the connecting member penetrates the insulating case, and includes a pipe member having conductivity with the first screw member provided at one end, a third screw member having conductivity and provided at the other end of the pipe member, and a connecting part having conductivity, fixed to the other end of the pipe member with the third screw member and connected to the second screw member.

Preferably, the first screw member, the second screw member and the third screw member are bolts. A first screw portion threadedly engaged with the first screw member and a second screw portion threadedly engaged with the second screw member are formed in an inner circumferential surface of the pipe member. The circuit substrate is held between the first screw member and the one end of the pipe member. The connecting part is held between the third screw member and the other end of the pipe member. Preferably, a bolt diameter of the first screw member is larger than the bolt diameter of the second screw member.

Preferably, the first screw member includes a bolt head and a shaft part formed to protrude from the bolt head and having a screw portion formed in a surface thereof. The substrate unit further includes a collar pipe arranged between the bolt head of the first screw member and the circuit substrate, the shaft part of the first screw member being inserted through the collar pipe. The connecting part is held between the collar pipe and the second screw member.

Advantageous Effects of Invention

With the substrate unit according to the present invention, the substrate can be fixed with the fixing member provided in the case, while conduction between the case and the substrate can be ensured.

DESCRIPTION OF EMBODIMENTS

Hereinafter, embodiments of the present invention will be described. The same or corresponding portions have the same reference characters allotted, and detailed description thereof may not be repeated. When the number, an amount or the like is mentioned in the embodiments described below, the scope of the present invention is not necessarily limited to that number, that amount or the like, unless otherwise specified. In addition, when a plurality of embodiments are shown below, combination as appropriate of features in the respective embodiments is originally planned, unless otherwise specified.

With reference to FIGS. 1 to 6, a substrate unit according to the present embodiment and an electric-powered vehicle including this substrate unit will be described.

Figure 1:
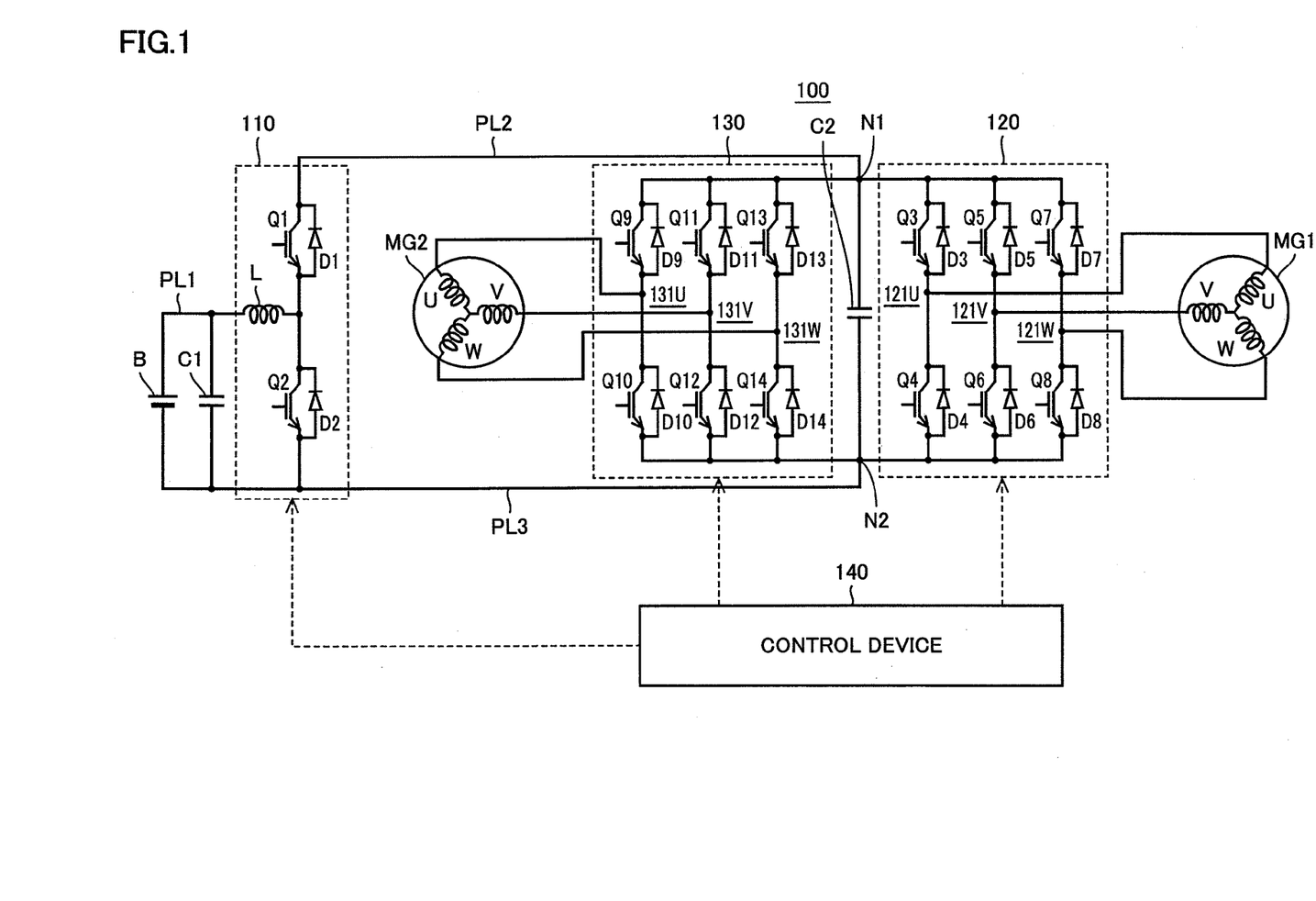
FIG. 1 is a circuit diagram showing a configuration of a main part of PCU to which a cooling device for semiconductor elements according to an embodiment of the present invention is applied.

FIG. 1 is a circuit diagram showing a configuration of a main part of PCU to which substrate unit 13 for semiconductor elements according to an embodiment of the present invention is applied. It is noted that PCU 100 shown in FIG. 1 is "a control device for a rotating electric machine driving a vehicle."

Referring to FIG. 1, PCU 100 includes a converter 110, inverters 120, 130, a control device 140, and capacitors C1, C2. Converter 110 is connected across a battery B and inverters 120, 130. Inverters 120, 130 are connected to motor generators MG1, MG2, respectively.

Converter 110 includes power transistors Q1, Q2, diodes D1, D2, and a reactor L. Power transistors Q1 and Q2 are connected in series and receive at the base a control signal from control device 140. Diodes D1, D2 are connected across the collector and the emitter of power transistors Q1, Q2, respectively, so as to flow current from the emitter to the collector of power transistors Q1, Q2, respectively. Reactor L has one end connected to a power source line PL1 connected to a positive electrode of battery B, and the other end connected to a junction between power transistors Q1 and Q2.

This converter 110 boosts a DC voltage sent from battery B using reactor L, and supplies the boosted voltage to a power source line PL2. Converter 110 steps down a DC voltage sent from inverters 120, 130 to charge battery B.

Inverters 120, 130 include U-phase arms 121U, 131U, V-phase arms 121V, 131V, and W-phase arms 121W, 131W, respectively. U-phase arm 121U, V-phase arm 121V and W-phase arm 121W are connected in parallel between nodes N1 and N2. Similarly, U-phase arm 131U, V-phase arm 131V and W-phase arm 131W are connected in parallel across nodes N1 and N2.

U-phase arm 121U includes two power transistors Q3, Q4 connected in series. Similarly, U-phase arm 131U, V-phase arms 121V, 131V, and W-phase arms 121W, 131W include two of power transistors Q5 to Q14 connected in series, respectively. Diodes D3 to D14 flowing current from the emitter to the collector are connected across the collector and the emitter of power transistors Q3 to Q14, respectively.

The midpoint of the arm of each phase of inverters 120, 130 is connected to an end of a coil of each phase of motor generators MG1, MG2, respectively. In motor generators MG1, MG2, three coils of U-, V- and W- phases each have one end commonly connected to a neutral point.

Capacitor C1 is connected across power source lines PL1 and PL3, and smoothes the voltage level of power source line PL1. Capacitor C2 is connected across power source lines power source lines PL2 and PL3, and smoothes the voltage level of power source line PL2.

Based on driving signals from control device 140, inverters 120, 130 convert a DC voltage from capacitor C2 into an AC voltage to drive motor generators MG1, MG2, respectively.

Control device 140 calculates a voltage of the coil of each phase of motor generators MG1, MG2 based on a motor torque command value, a current value of each phase of motor generators MG1, MG2, and an input voltage of inverters 120, 130, and based on a result of that calculation, generates a PWM (Pulse Width Modulation) signal for turning power transistors Q3 to Q14 on/off for output to inverters 120, 130.

Further, control device 140 calculates a duty ratio of power transistors Q1, Q2 for optimizing the input voltage of inverters 120, 130 based on the above-mentioned motor torque command value and a motor speed, and based on a result of that calculation, generates a PWM signal for turning power transistors Q1, Q2 on/off for output to converter 110.

Furthermore, control device 140 controls switching operation of power transistors Q1 to Q14 in converter 110 and inverters 120, 130, in order to convert AC power generated by motor generators MG1, MG2 into DC power to charge battery B.

While PCU 100 is operating, power transistors Q1 to Q14 and diodes D1 to D14 constituting converter 110 and inverters 120, 130 generate heat. It is therefore necessary to provide a cooling device for promoting cooling of these semiconductor elements.

Figure 2:
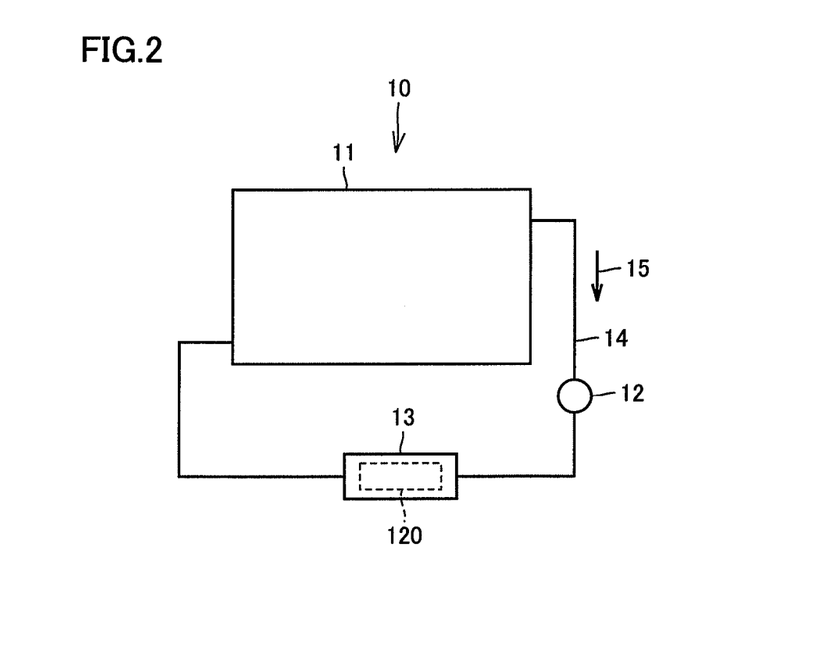
FIG. 2 is a circuit diagram schematically showing a cooling circuit 10 cooling an inverter 120.

FIG. 2 is a circuit diagram schematically showing cooling circuit 10 cooling inverter 120. As shown in this FIG. 2, cooling circuit 10 includes a heat exchanger 11, a pump 12, substrate unit 13, and a coolant pipe 14 through which a coolant 15 flows, each being provided in a radiator of a vehicle.

Coolant pipe 14 connects heat exchanger 11 and pump 12, pump 12 and substrate unit 13, as well as substrate unit 13 and heat exchanger 11.

Heat exchanger 11 cools coolant 15 through use of outside air. Coolant 15 having been cooled is supplied to substrate unit 13 with pump 12. Substrate unit 13 is provided with a cooler which will be described later. The coolant is supplied to this cooler. This cooler cools each element of inverter 120 provided inside substrate unit 13. Coolant 15 discharged from substrate unit 13 is supplied to heat exchanger 11, and is cooled within heat exchanger 11.

Figure 3:
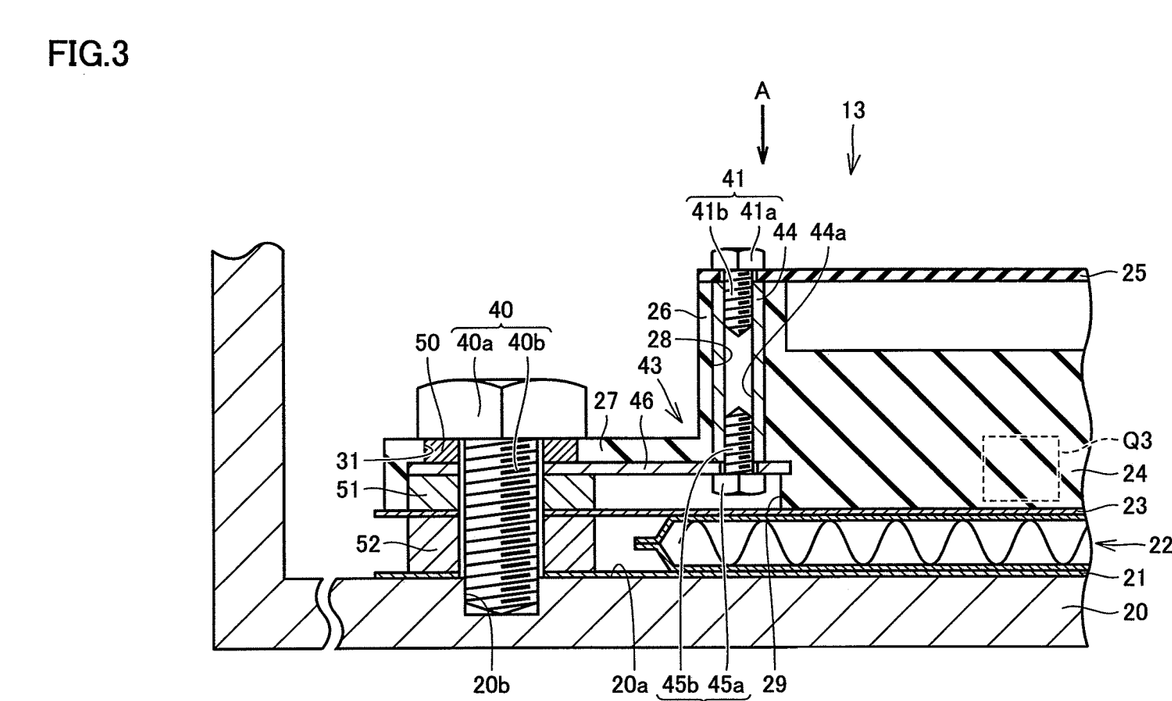
FIG. 3 is a cross sectional view showing part of a substrate unit 13.

FIG. 3 is a cross sectional view showing part of substrate unit 13. As shown in this FIG. 3, substrate unit 13 includes a conductive die-cast case 20, a metal plate 21 provided on an inner wall surface 20a of die-cast case 20, a cooler 22 provided on this metal plate 21, a plate member 23 provided on cooler 22, a resin case 24 provided on plate member 23, and a control substrate 25 fixed to resin case 24. Substrate unit 13 further includes screw member 40 fixing resin case 24 to inner wall surface 20a and screw member 41 fixing control substrate 25 to resin case 24.

Die-cast case 20 is made of, for example, a conductive material, such as aluminum, and has a box shape. Cooler 22, resin case 24, control substrate 25, screw member 40, and screw member 41 are stored in die-cast case 20.

Cooler 22 has formed therein a coolant path through which coolant 15 flows, and a radiation fin is arranged in this coolant path. Plate member 23 is a plate-like member made of metal, for example.

Resin case 24 is arranged opposite to inner wall surface 20a with respect to cooler 22. Resin case 24 is made of an insulating resin material. In this resin case 24, elements of inverter 120, such as power transistor Q3 and diodes, as well as a bus bar connecting these elements and control substrate 25 are arranged. It is noted that, while FIG. 3 schematically shows power transistor Q3 representatively, power transistors Q3 to Q8 and diodes D3 to D8 are stored in resin case 24.

The power transistors and the diodes are provided in resin case 24 at a location positioned above cooler 22. Since coolant 15 flows inside cooler 22, the power transistors and the diodes are cooled.

Resin case 24 includes a boss part 26 protruding upwardly from the upper surface of resin case 24 and a projecting part 27 provided on the outer circumference of resin case 24. Boss part 26 has a through-hole 28 formed therein.

In the surfaces of resin case 24, a recess 29 communicating with through-hole 28 is formed in the lower surface opposed to cooler 22. Projecting part 27 has a through-hole 31 formed therein. Through-hole 31 is formed to reach recess 29. This resin case 24 is fixed to inner wall surface 20a of die-cast case 20 with screw member 40.

Screw member 40 is made of a conductive material, and is implemented by a bolt in this example shown in FIG. 3. Screw member 40 can be implemented by fixing means, such as a screw.

Screw member 40 includes a head part 40a and a shaft part 40b connected to this head part 40a. Head part 40a is formed to have a larger diameter than shaft part 40b. A threaded portion is formed in the outer circumferential surface of shaft part 40b. Screw member 40 is screwed in inner wall surface 20a. Head part 40a is formed to have a larger diameter than the opening diameter of through-hole 31. Head part 40a presses a portion of projecting part 27 positioned around through-hole 31 toward inner wall surface 20a.

It is noted that resin case 24 is fixed to die-cast case 20 by head part 40a pressing the upper surface of projecting part 27 toward inner wall surface 20a. A specific structure thereof will be described later.

The leading end of shaft part 40b is inserted in a screw hole 20b formed in inner wall surface 20a of die-cast case 20. Shaft part 40b is threadedly engaged with a female screw portion formed in screw hole 20b.

Control substrate 25 constitutes at least part of control device 140 shown in FIG. 1. Control substrate 25 is fixed with screw member 41.

Screw member 41 is made of a conductive material. Screw member 41 includes a head part 41a and a shaft part 41b connected to head part 41a. Screw member 41 is screwed in toward inner wall surface 20a. Head part 41a is formed to have a larger diameter than shaft part 41b. A threaded portion is formed in the outer circumferential surface of shaft part 41b. It is noted that screw member 41 is implemented by a bolt in this example shown in FIG. 3, but can be implemented by other fixing means, such as a screw.

Screw member 41 is positioned opposite to inner wall surface 20a with respect to resin case 24, and is positioned above cooler 22 and the elements such as the power transistors. Therefore, control substrate 25 is positioned above resin case 24, the power transistors and the like. Accordingly, the power transistors and the diodes can be cooled with cooler 22, and wiring length of the bus bar (connection wiring) connecting the power transistors and the diodes to control substrate 25 can be shortened.

It is noted that the bolt diameter of shaft part 40b of screw member 40 (outer diameter of shaft part 40b) is larger than the bolt diameter of shaft part 41b (outer diameter of shaft part 41b). Therefore, resin case 24 is firmly fixed to die-cast case 20 with great pressure. It is noted that, of projecting part 27, a portion pressed by head part 40a has a thickness thicker than that of control substrate 25, and projecting part 27d is formed to resist great clamping force.

As is also clear from FIG. 3, when screw members 40 and 41 are seen from a position away from inner wall surface 20a in a direction that inner wall surface 20a and cooler 22 are arranged, screw members 40 and 41 are separated from each other. In other words, when screw members 40 and 41 are seen in the direction of an arrow A in FIG. 3, screw members 40 and 41 are spaced from each other.

In this way, screw members 40 and 41 are provided not to overlap each other in the direction that screw members 40 and 41 are screwed in. Therefore, in assembling substrate unit 13, screw member 41 can be screwed into boss part 26 in the direction of arrow A, and screw member 40 can be screwed into inner wall surface 20a.

Screw members 40 and 41 are electrically connected to each other with connecting member 43. Connecting member 43 includes a cylindrical member 44 provided in through-hole 28, a screw member 45 fixed to the lower end of cylindrical member 44, and a bus bar 46 fixed to the lower end of cylindrical member 44 with screw member 45 and connected to screw member 40.

Figure 4:
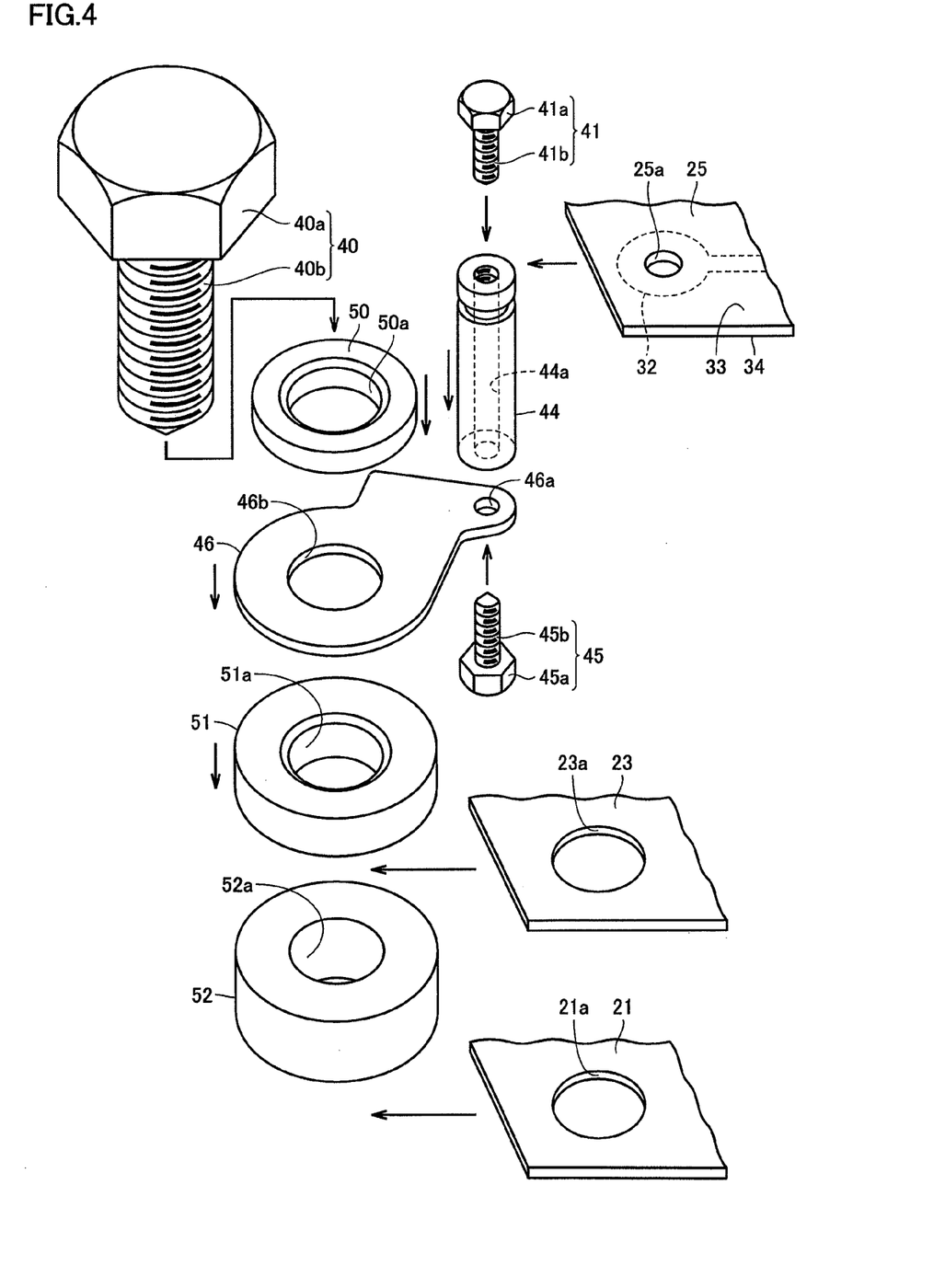
FIG. 4 is an exploded perspective view showing a screw member 40, a screw member 41 and a connecting member 43, as well as members positioned around these members.

FIG. 4 is an exploded perspective view showing screw members 40, 41 and connecting member 43, as well as members positioned around these members.

In this FIG. 4 and FIG. 3 described above, cylindrical member 44 is made of a conductive metal material, such as brass, for example. This cylindrical member 44 has a cylindrical shape. This cylindrical member 44 has a through-hole 44a formed therein. A threaded portion is formed in the inner circumferential surface of through-hole 44a.

Control substrate 25 has a through-hole 25a formed therein. Shaft part 41b of screw member 41 passes through through-hole 25a to be threadedly engaged with the threaded portion formed in the inner circumferential surface of through-hole 44a.

Control substrate 25 is held between head part 41a of screw member 41 and the top end of cylindrical member 44. Control substrate 25 is fixed to the top end of cylindrical member 44. It is noted that, as shown in FIG. 3, the upper end surface of boss part 26 and the upper end surface of cylindrical member 44 are generally flush with each other. Therefore, control substrate 25 is fixed with screw member 41, thereby being pressed against the upper end surface of boss part 26 and the upper end surface of cylindrical member 44.

Control substrate 25 includes main surfaces 33 and 34 arranged in the thickness direction. Through-hole 25a is formed so as to reach main surface 34 from main surface 33.

On main surface 34, a terminal part 32 is formed around the opening edge of through-hole 25a. By fixing control substrate 25 between head part 41a and the top end of cylindrical member 44, terminal part 32 and cylindrical member 44 are electrically connected to each other. It is noted that, although terminal part 32 is formed in main surface 34 in the example shown in FIG. 4, terminal part 32 may be formed in main surface 33. In this case, head part 41a of screw member 41 and terminal part 32 come into contact with each other. Screw member 41 provided with head part 41a is in contact with cylindrical member 44, so that terminal part 32, screw member 41 and cylindrical member 44 are electrically connected to one another.

Bus bar 46 is also made of a conductive material. In this example shown in FIG. 4, bus bar 46 has a plate shape. Bus bar 46 has through-holes 46a and 46b formed therein.

Through-holes 46a and 46b are spaced from each other, and through-hole 46a is arranged under cylindrical member 44.

Screw member 45 includes a head part 45a and a shaft part 45b connected to this head part 45a. Head part 45a is formed to have a larger diameter than shaft part 45b. An external thread is formed in the outer circumferential surface of shaft part 45b. It is noted that screw member 45 is implemented by a bolt in the example shown in FIGS. 3 and 4, but can be implemented by a screw.

Screw member 45 is screwed in cylindrical member 44 from the lower surface of bus bar 46. The external screw formed in the outer circumferential surface of shaft part 45b is threadedly engaged with the female screw formed in the inner surface of through-hole 44a. Bus bar 46 is held between head part 45a and cylindrical member 44 and is fixed to the lower end of cylindrical member 44. Cylindrical member 44 and bus bar 46 are electrically connected to each other.

Bus bar 46 includes a lower surface opposed to inner wall surface 20a and an upper surface positioned opposite to this lower surface. A collar 50 is arranged on the upper surface of bus bar 46. Collars 51 and 52 are arranged between the lower surface of bus bar 46 and inner wall surface 20a. Collars 50, 51 and 52 are each made of a conductive material, such as a metal material.

Collar 50 has a through-hole 50a formed therein. Collar 50 is arranged on bus bar 46 such that through-holes 50a and 46b communicate with each other. Collars 51, 52 also have formed therein through-holes 51a, 52a, respectively.

Plate member 23 is held between collars 51 and 52, and metal plate 21 is held between collar 52 and inner wall surface 20a. Plate member 23 has a through-hole 23a formed therein. Metal plate 21 also has a through-hole 21a formed therein.

Metal plate 21, collar 52, plate member 23, collar 51, bus bar 46, and collar 50 are arranged sequentially on inner wall surface 20a such that screw hole 20b formed in inner wall surface 20a and through-holes 21a, 52a, 23a, 51a, 46b, and 50a may communicate with one another.

Shaft part 40b of screw member 40 is inserted to pass through the respective through-holes. Shaft part 40b is threadedly engaged with the female screw formed in the inner surface of screw hole 20b. Since screw member 40 is provided at projecting part 27 formed to project from cooler 22, screw member 40 is provided at a position away from cooler 22. As a result, shaft part 40b of screw member 40 does not penetrate cooler 22, achieving simplification of the structure of cooler 22.

Since shaft part 40b is screwed into screw hole 20b, projecting part 27, collar 50, bus bar 46, and collars 51, 52 are held by head part 40a and inner wall surface 20a. Projecting part 27, collar 50, bus bar 46, collar 51, plate member 23, collar 52, and metal plate 21 are thus fixed. Since projecting part 27 is fixed, resin case 24 is fixed to die-cast case 20.

On this occasion, head part 40a is in contact with the upper surface of collar 50, and further, shaft part 40b is connected to die-cast case 20. Therefore, control substrate 25 and die-cast case 20 are electrically connected to each other with cylindrical member 44, bus bar 46, collar 50, and screw member 40.

Accordingly, an abnormal voltage can be prevented from occurring in control substrate 25, and driving of control substrate 25 can be stabilized. Moreover, since a ground path connecting control substrate 25 and die-cast case 20 is formed using screw member 41 fixing control substrate 25 and screw member 40 fixing resin case 24, the number of parts can be reduced as compared with the case of providing a separate ground path.

Furthermore, the respective members forming the ground path are fixed firmly to each other with clamping force by the screw members. Therefore, electric resistance from control substrate 25 to die-cast case 20 can be minimized.

An example of how to assemble substrate unit 13 thus structured will be described briefly. In FIGS. 3 and 4, cylindrical member 44 is inserted (press fit) into through-hole 28 of resin case 24. Then, screw member 45 is screwed into cylindrical member 44 to fix bus bar 46 to the lower end of cylindrical member 44.

Next, metal plate 21, cooler 22, collar 52, plate member 23, and collar 51 are arranged on inner wall surface 20a. Next, resin case 24 with cylindrical member 44, screw member 45 and bus bar 46 fixed thereto is arranged on plate member 23.

Next, screw member 40 is screwed into screw hole 20b to fix resin case 24 to die-cast case 20. Next, control substrate 25 is fixed to the top end of cylindrical member 44 with screw member 41. In this manner, substrate unit 13 shown in FIG. 3 can be assembled. It is noted that control substrate 25 may be fixed to resin case 24 to unitize control substrate 25 and resin case 24, and then unitized resin case 24 may be fixed to die-cast case 20. In either case, one of screw members 40 and 41 is prevented from interfering with the other one during attachment of screw members 40, 41.

It is noted that the above-described assembly procedure is merely an example, and some interchange in the procedure is originally planned at the time of application. Furthermore, although only one screw member is provided as each of screw members 40 and 41 in the example shown in FIGS. 3 and 4, a plurality of screw members may be provided as each of screw members 40 and 41.

In this way, in substrate unit 13 according to the present embodiment, screw member 41 fixing control substrate 25 to resin case 24 and screw member 40 fixing resin case 24 to die-cast case 20 are electrically connected to each other with connecting member 43, so that control substrate 25 and die-cast case 20 are electrically connected to each other.

Figure 5:
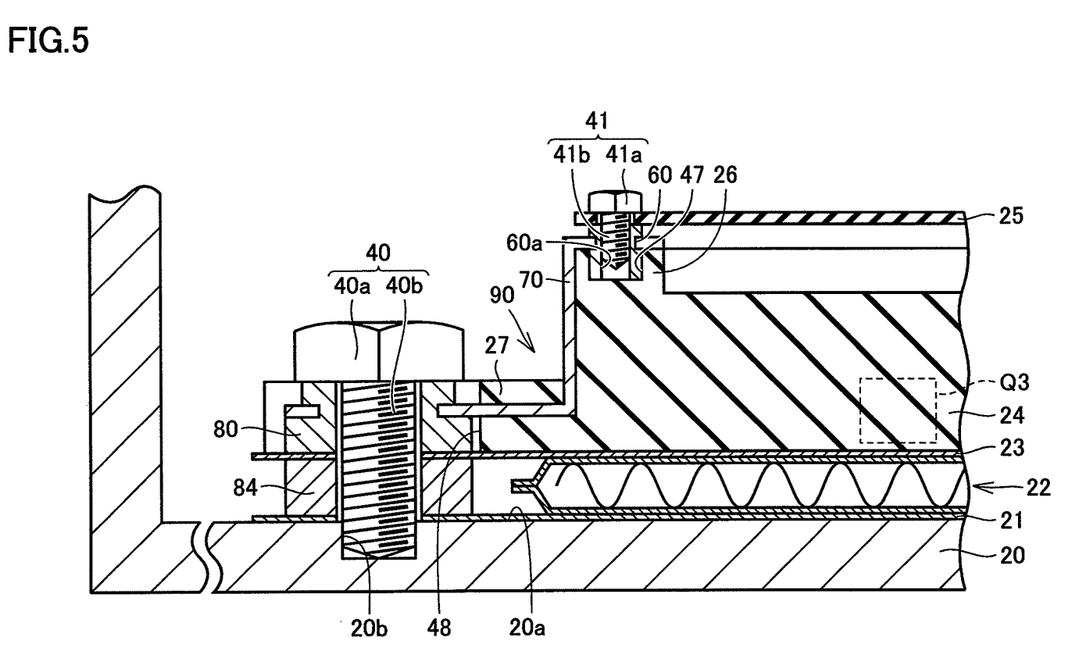
FIG. 5 is a cross sectional view showing a variation of substrate unit 13 according to the present embodiment.
Figure 6:
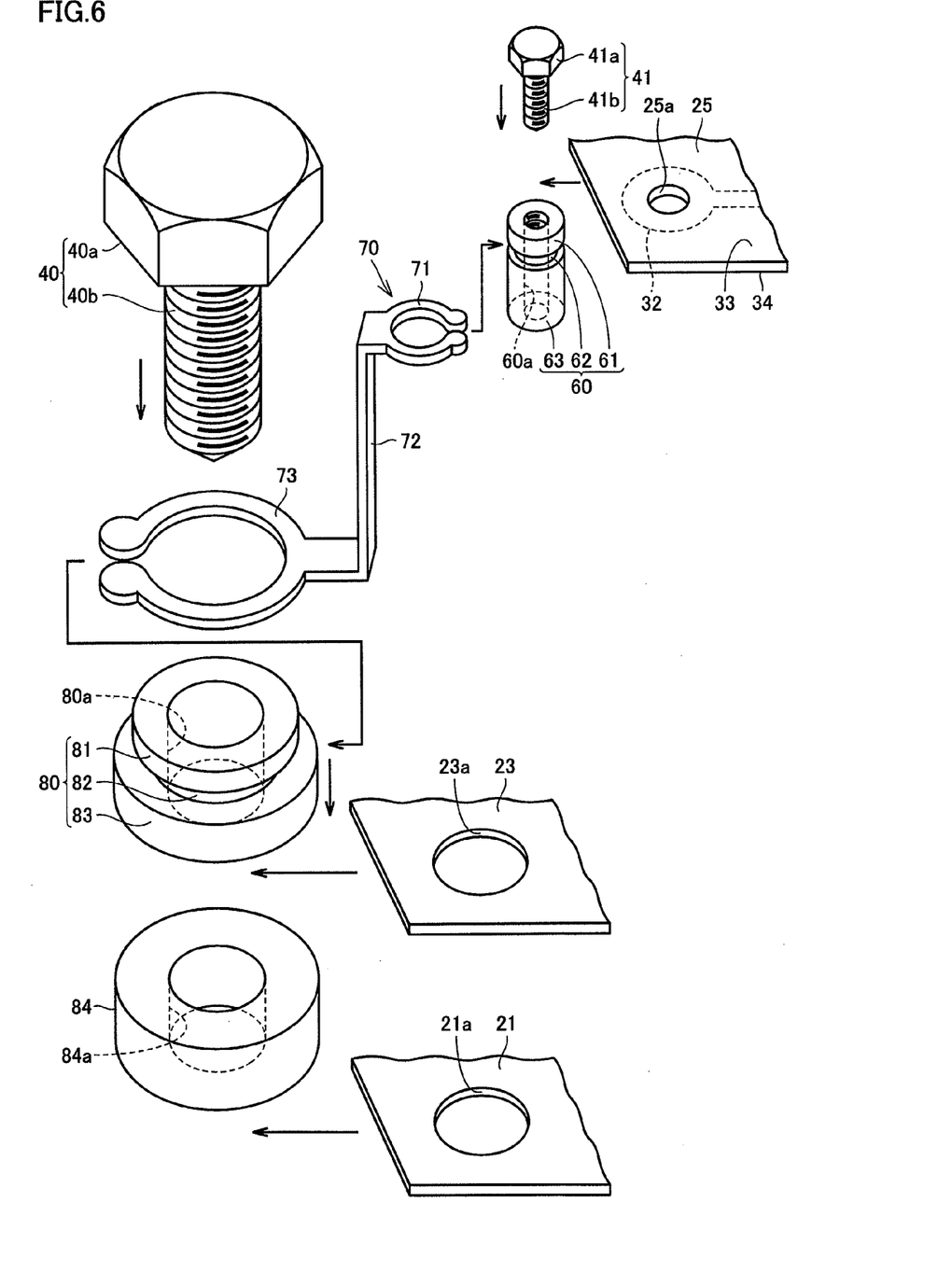
FIG. 6 is an exploded perspective view showing a connecting member 70 and screw members 40, 41 shown in FIG. 5, as well as members positioned around these members.

FIG. 5 is a cross sectional view showing a variation of substrate unit 13 according to the present embodiment. FIG. 6 is an exploded perspective view showing connecting member 70 and screw members 40, 41 shown in FIG. 5, as well as members positioned around these members.

It is noted that, in the structure shown in FIGS. 5 and 6, the same/corresponding features as/to the features shown in FIGS. 1 to 4 as described above have the same reference characters allotted, and description thereof may not be repeated.

In FIGS. 5 and 6, substrate unit 13 includes control substrate 25, resin case 24 including boss part 26 and projecting part 27, screw member 41 fixing control substrate 25 to resin case 24, screw member 40 fixing resin case 24 to die-cast case 20, and connecting member 70 electrically connecting screw members 41 and 40. Metal plate 21, a collar 84 arranged on this metal plate 21, and a collar 80 arranged on collar 84 are arranged between head part 40a of screw member 40 and inner wall surface 20a.

Boss part 26 has a hole part 47 formed therein. A slit part 48 is formed in the outer circumferential part of projecting part 27.

A conductive cylindrical member 60 is arranged inside hole part 47. This cylindrical member 60 has a through-hole 60a formed therein. A female screw to be threadedly engaged with shaft part 41b is formed in the inner surface of through-hole 60a.

As shown in FIG. 6, cylindrical member 60 includes a head part 61, a neck part 62 and a body part 63. Neck part 62 is arranged between head part 61 and body part 63. The outer diameter of neck part 62 is smaller than the outer diameter of each of head part 61 and body part 63.

When shaft part 41b of screw member 41 is screwed into cylindrical member 60, head part 41a presses control substrate 25 against the top end of cylindrical member 60. Accordingly, terminal part 32 is electrically connected to the top end of cylindrical member 60.

Connecting member 70 includes a connecting part 72, a gripping part 71 provided at one end of connecting part 72, and a gripping part 73 provided at the other end of connecting part 72. Gripping part 71 includes two arm portions. These two arm portions are mounted on the outer circumference of neck part 62.

With gripping part 73 being mounted on neck part 62, connecting member 70 and cylindrical member 60 are electrically connected to each other.

Collar 80 includes a head part 81, a neck part 82 and a body part 83. The outer diameter of neck part 82 is smaller than the outer diameter of each of head part 81 and body part 83.

Gripping part 73 of connecting member 70 includes two curved arm portions. Gripping part 73 is mounted on the outer circumferential surface of neck part 82.

When neck part 82 is mounted on gripping part 73, connecting member 70 and collar 80 are electrically connected to each other.

Collar 80 has a through-hole 80a formed therein. Collar 84 arranged under collar 80 also has a through-hole 84a formed therein. Pate member 23 is arranged between collars 80 and 84, and metal plate 21 is arranged between collar 84 and inner wall surface 20a.

Shaft part 40b of screw member 40 passes through through-holes 80a, 23a, 84a, and 21a to be threadedly engaged with the female screw formed in the inner circumferential surface of screw hole 20b. With shaft part 40b and screw hole 20b being threadedly engaged with each other, head part 40a presses a portion of the upper surface of projecting part 27 positioned around slit part 48, toward inner wall surface 20a.

Accordingly, projecting part 27, collar 80, plate member 23, collar 84, and metal plate 21 are fixed with head part 40a and inner wall surface 20a.

On this occasion, head part 40a is in contact with head part 81 of collar 80, so that screw member 40 and connecting member 70 are electrically connected to each other.

Furthermore, with shaft part 40b of screw member 40 being screwed into screw hole 20b, screw member 40 and die-cast case 20 are electrically connected to each other.

Accordingly, terminal part 32 of control substrate 25 and die-cast case 20 are electrically connected to each other, and driving of control substrate 25 can be stabilized.

It is noted that, also in this example shown in FIGS. 5 and 6, screw members 41 and 40 are spaced from each other. Therefore, when assembling substrate unit 13, screw members 40 and 41 can be rotated from the inside of die-cast case 20.

In this way, also in this example shown in FIGS. 5 and 6, by electrically connecting screw member 41 fixing control substrate 25 and screw member 40 fixing resin case 24 to die-cast case 20 with connecting member 70, control substrate 25 and die-cast case 20 are electrically connected to each other.

Although the embodiment of the present invention has been described in detail, it should be understood that the embodiment disclosed herein is illustrative and non-restrictive in every respect. The scope of the present invention is defined by the claims, and is intended to include any modification within the meaning and scope equivalent to the terms of the claims. Furthermore, the above-described numerical values and the like are illustrative and are not limited to the above-described numerical values and range.

INDUSTRIAL APPLICABILITY

The present invention relates to a substrate unit, and is particularly applicable to a substrate unit in which a substrate is provided inside a case.

REFERENCE SIGNS LIST 10 cooling circuit; 11 heat exchanger; 12 pump; 13 substrate unit; 14 coolant pipe; 15 coolant; 20 die-cast case; 20a inner wall surface; 20b screw hole; 21 metal plate; 21a, 23a, 25a, 28, 31, 44a, 46a, 46b, 50a, 51a, 52a, 60a, 80a and 84a through-hole; 22 cooler; 23 plate member; 24 resin case; 25 control substrate; 26 boss part; 27 projecting part; 29 recess; 32 terminal part; 33, 34 main surface; 40, 41, 45 screw member; 40*a*, 41*a*, 45*a*, 61, 81 head part; 40*b*, 41*b*, 45*b* shaft part; 43, 70 connecting member; 44, 60 cylindrical member; 46 bus bar; 47 hole part; 48 slit part; 50, 51, 52, 80, 84 collar; 62, 82 neck part; 63 body part; 71, 73 gripping part; 72 connecting part; 83 body part; 110 converter; 120, 120, 130 inverter; 140 control device; A arrow; B battery.

The invention claimed is:

1. A substrate unit comprising:
   a conductive case having conductivity;
   an insulating case arranged in said conductive case;
   a first screw member having conductivity, arranged in said conductive case and fixing said insulating case to an inner wall surface of said conductive case;
   a circuit substrate provided opposite to said inner wall surface with respect to said insulating case and fixed to said insulating case; and
   a second screw member having conductivity and fixing said circuit substrate to said insulating case,
   said first screw member and said second screw member being screwed in toward said inner wall surface, when said first screw member and said second screw member are seen from a position away from said inner wall surface in a direction that said inner wall surface and said insulating case are arranged, said first screw member and said second screw member being spaced from each other, and
   said first screw member and said second screw member being connected to each other with a connecting member having conductivity.

2. The substrate unit according to claim 1, further comprising:
   a cooler arranged between said inner wall surface of said conductive case and said insulating case; and
   an element arranged in said insulating case, wherein
   said insulating case includes a projecting part projecting from an outer circumference of said cooler,
   said first screw member is provided in said projecting part, and
   said second screw member is arranged opposite to said cooler with respect to said insulating case.

3. The substrate unit according to claim 2, wherein said connecting member penetrates said insulating case, and includes a pipe member having conductivity with said second screw member provided at one end, a third screw member having conductivity and provided at the other end of said pipe member, and a connecting part having conductivity, fixed to the other end of said pipe member with said third screw member and connected to said first screw member.

4. The substrate unit according to claim 3, wherein
   said first screw member, said second screw member and said third screw member are bolts,
   a first screw portion threadedly engaged with said second screw member and a second screw portion threadedly engaged with said third screw member are formed in an inner circumferential surface of said pipe member,
   said circuit substrate is held between said second screw member and the one end of said pipe member, and
   said connecting part is held between said third screw member and the other end of said pipe member.

5. The substrate unit according to claim 4, wherein
   said first screw member includes a bolt head and a shaft part formed to protrude from said bolt head and having a screw portion formed on a surface thereof,
   said substrate unit further comprising a collar pipe arranged between the bolt head of said first screw member and said connecting part, the shaft part of said first screw member being inserted through said collar pipe, wherein
   said connecting part is disposed between said collar pipe and said third screw member.

6. The substrate unit according to claim 1, wherein a bolt diameter of said first screw member is larger than the bolt diameter of said second screw member.

* * * * *